United States Patent
Bartlett et al.

(10) Patent No.: US 8,082,741 B2
(45) Date of Patent: Dec. 27, 2011

(54) INTEGRAL FACET CRYOPUMP, WATER VAPOR PUMP, OR HIGH VACUUM PUMP

(75) Inventors: Allen J. Bartlett, New London, NH (US); Joseph A. Kraus, Pepperell, MA (US); Michael J. Eacobacci, Jr., South Attleboro, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 1260 days.

(21) Appl. No.: 11/803,420

(22) Filed: May 15, 2007

(65) Prior Publication Data

US 2008/0282710 A1    Nov. 20, 2008

(51) Int. Cl.
F17C 13/00    (2006.01)

(52) U.S. Cl. .......................................... 62/50.7; 62/55.5

(58) Field of Classification Search ............... 62/55.5, 62/50.7, 51.1; 118/719; 438/715, 737, 974
See application file for complete search history.

(56) References Cited

U.S. PATENT DOCUMENTS

| | | | |
|---|---|---|---|
| 4,693,777 A | 9/1987 | Hazano et al. | |
| 4,990,047 A | 2/1991 | Wagner et al. | |
| 5,154,730 A * | 10/1992 | Hodos et al. | |
| 5,286,296 A | 2/1994 | Sato et al. | |
| 5,695,564 A | 12/1997 | Imahashi | |
| 5,981,399 A | 11/1999 | Kawamura et al. | |
| 6,251,192 B1 | 6/2001 | Kawamura et al. | |
| 6,517,048 B2 | 2/2003 | Ettinger et al. | |
| 6,530,993 B2 | 3/2003 | Hwang et al. | |
| 6,562,141 B2 | 5/2003 | Clarke | |
| 6,740,585 B2 * | 5/2004 | Yoon et al. ................... 438/680 |
| 6,755,028 B2 | 6/2004 | Gaudet et al. | |
| 6,905,107 B2 | 6/2005 | Blahnik | |
| 2002/0000194 A1 | 1/2002 | Clarke | |

(Continued)

FOREIGN PATENT DOCUMENTS

WO     WO 00/30155     5/2000

(Continued)

OTHER PUBLICATIONS

Jan. 26, 2009, International Search Report, PCT/US2008/005567.

*Primary Examiner* — Mohammad Ali
(74) *Attorney, Agent, or Firm* — Hamilton, Brook, Smith & Reynolds, P.C.

(57) ABSTRACT

A cluster tool has a transfer chamber, and a load lock chamber. An adaptor is configured to be coupled between the transfer chamber and the load lock chamber. The adaptor has an adaptor housing with an interior space including an entrance with a first valve and an exit with a second valve. The adaptor housing forms a substrate path through the interior space. The first valve connects the interior space and the load lock chamber. The second valve connects the interior space and the transfer chamber. A cryogenic surface is associated with the adaptor. Other pumps can be associated with the adaptor, such as, for example, a turbo pump, or water vapor pump. The cryogenic surface is configured to selectively evacuate the interior space. A wafer is adapted to be moved through the first valve and through the adaptor housing along the path. The wafer is moved through the exit and into the transfer chamber once the second valve is opened. This adaptor can be applied to the process chamber as well as the load lock.

31 Claims, 10 Drawing Sheets

U.S. PATENT DOCUMENTS

| | | |
|---|---|---|
| 2002/0096656 A1 | 7/2002 | Krocker et al. |
| 2002/0129910 A1 | 9/2002 | Lightner |
| 2002/0159864 A1 | 10/2002 | Lowrance |
| 2004/0185670 A1 | 9/2004 | Hamelin et al. |
| 2004/0217302 A1 | 11/2004 | Shin et al. |
| 2004/0221811 A1 | 11/2004 | Mitchell et al. |
| 2004/0238122 A1 | 12/2004 | Ishizawa et al. |
| 2004/0245489 A1 | 12/2004 | Kurita et al. |
| 2005/0095088 A1 | 5/2005 | Kurita et al. |
| 2006/0011140 A1 | 1/2006 | Blahnik et al. |
| 2006/0026968 A1 | 2/2006 | Gao |
| 2006/0034673 A1 | 2/2006 | Choi et al. |
| 2006/0064990 A1 | 3/2006 | Bartlett et al. |
| 2006/0169939 A1 | 8/2006 | Kihara et al. |
| 2006/0182534 A1 | 8/2006 | Hiroki |
| 2007/0151514 A1* | 7/2007 | Chen et al. .................... 118/715 |
| 2007/0269297 A1* | 11/2007 | Meulen et al. ........... 414/222.01 |

FOREIGN PATENT DOCUMENTS

| | | | |
|---|---|---|---|
| WO | WO 2008/143766 A2 | 11/2008 | |

* cited by examiner

INTEGRAL FACET CRYOPUMP, WATER VAPOR PUMP, OR HIGH VACUUM PUMP

BACKGROUND OF THE INVENTION

A cluster tool includes processing chambers, internal robots to manipulate wafers, and load lock chambers where wafer exchanges take place from the load lock chamber to the transfer chamber. The transfer chamber is held at a low vacuum pressure. The load lock chamber is connected to the transfer chamber by a valve. The load lock chamber receives a wafer from atmospheric pressure. The vacuum pressure of the transfer chamber/buffer will increase once it is opened to receive a wafer. Thereafter, the transfer chamber will be pumped by a vacuum pump to return to the vacuum pressure.

Sometimes long recovery times may be needed for the transfer chamber to return to the vacuum pressure, once the transfer chamber is closed and receives the wafer from the load lock chamber. Such long recovery times can be detrimental to throughput. A recovery time associated with the transfer chamber/buffer returning to a low vacuum pressure should be conceivably as short as possible so manufacturing deposition processes can occur in vacuum conditions.

Additionally, cluster tools can include chambers with several different valve separation configurations. Different chambers can be separated by valves to maintain vacuum conditions, such as a load lock chamber and a transfer chamber. Valve arrangements can be costly. These configurations can also include an isolation valve that separates a vacuum pump from a chamber, such as a transfer chamber, or a valve that separates a rough pump from a load lock chamber. Numerous sets of valves are costly and can drive up the overall cost of the cluster tool. Moreover, each valve is often controlled in a precise manner to open and close to affect a wafer transfer. Valve control is also costly and may increase the overall operation cost of the cluster tool.

Further, regeneration operations often can result in a suspension of the manufacturing processing to remove materials from a primary pumping surface of a cryogenic pump. These regeneration operations can also decrease throughput of the cluster tool.

SUMMARY OF THE INVENTION

In one embodiment, a cluster tool has a transfer chamber, a load lock chamber, and an adaptor configured to be coupled between the transfer chamber and the load lock chamber. The adaptor has an adaptor housing with an interior space. This includes an entrance with a first valve and an exit with a second valve. The adaptor housing forms a substrate path through the interior space. The first valve connects the interior space and the load lock chamber. The second valve connects the interior space and the transfer chamber. A cryogenic surface is associated with the adaptor and is configured to selectively evacuate the interior space. A wafer is adapted to be moved through the first valve and through the adaptor housing along the path and configured to be moveable through the exit and into the transfer chamber once the second valve is opened.

In another embodiment, there is provided a method of evacuating a cluster tool having a load lock chamber connected to a transfer chamber. The method provides that an adaptor that is located between the load lock chamber and a transfer chamber. A wafer is inserted into the load lock chamber and the load lock chamber is pumped. The transfer chamber is pumped from the adaptor and the wafer is passed through the load lock chamber, through the adaptor, and to the transfer chamber. The wafer can be transferred in one step or two steps from the load lock chamber through the adaptor, and to the transfer chamber. Thereafter, the transfer chamber can be pumped from a second adaptor. Both the transfer chamber and the load lock chamber can be pumped from the adaptor, or the transfer chamber can be pumped from the adaptor and the load lock chamber can be pumped from the load lock chamber.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of preferred embodiments of the invention follows.

Figure 1:
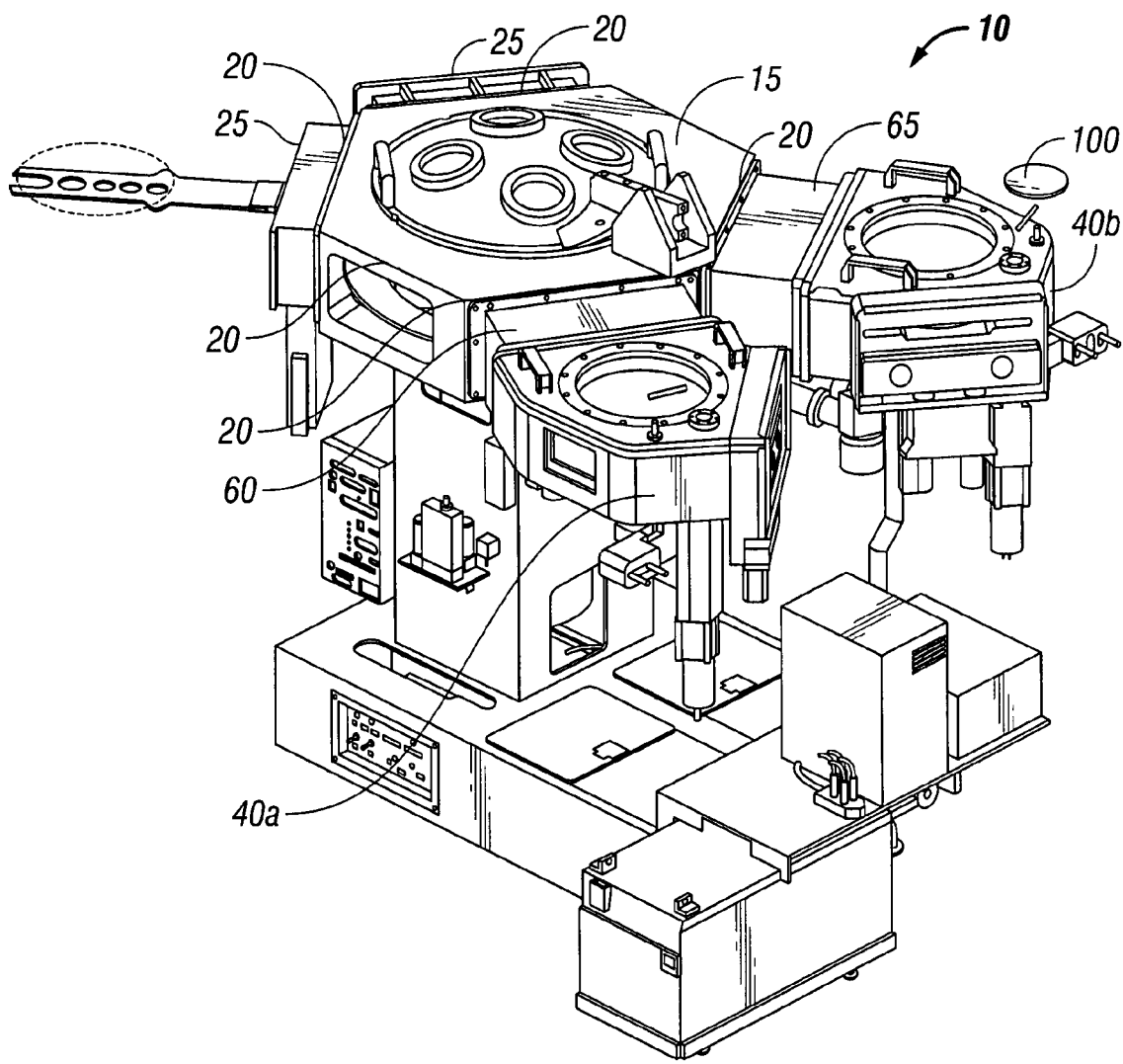
FIG. 1 shows a perspective view of a cluster tool having a facet adaptor according to the present invention.
Figure 2A:
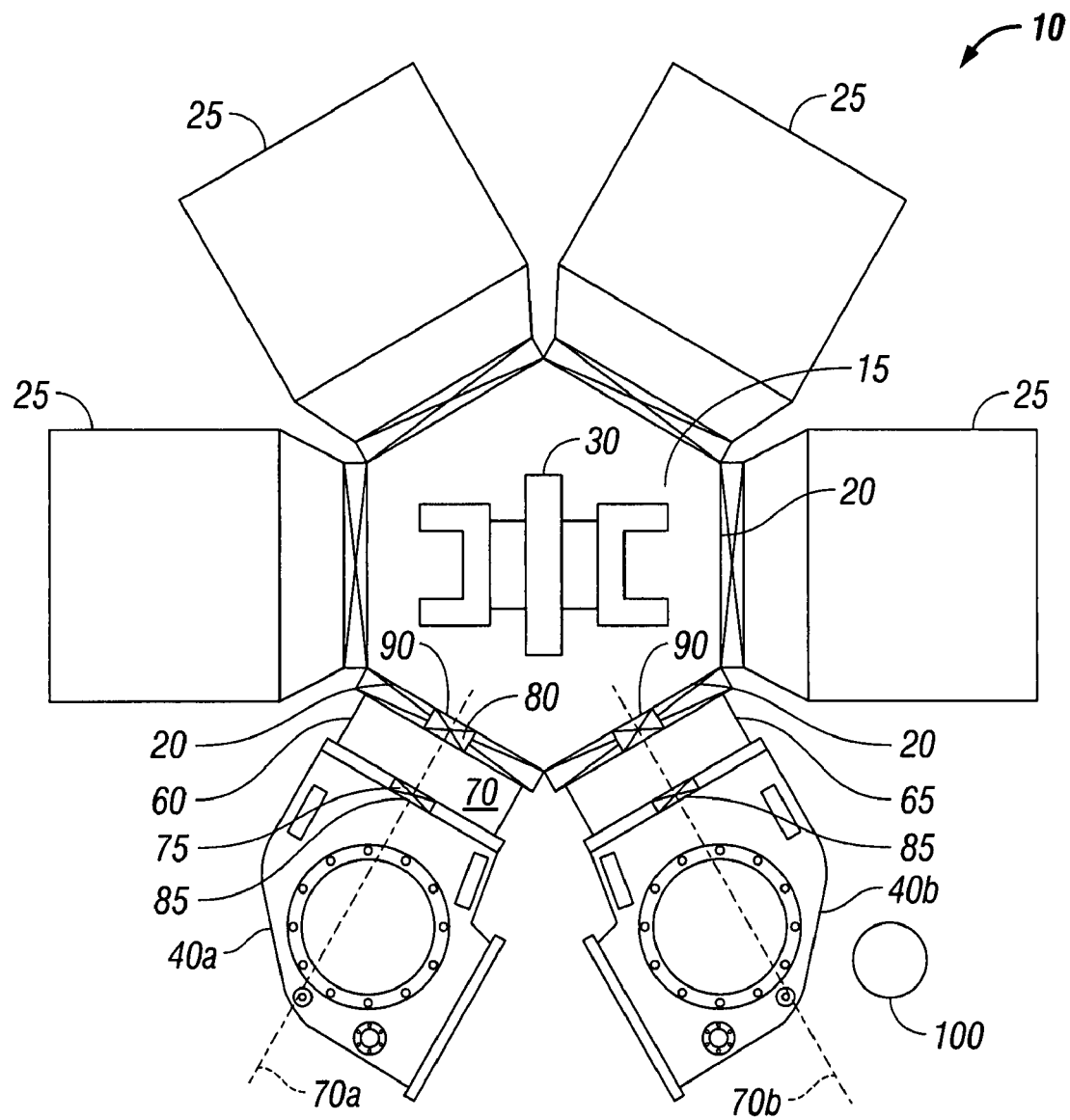
FIG. 2A shows a top schematic view of the cluster tool of FIG. 1.

Turning now to FIG. 1 and 2A, there is shown a first embodiment of the present disclosure of a cluster tool 10 for use in ultrahigh vacuum chemical vapor deposition ("CVD") manufacturing. The cluster tool 10 includes a transfer chamber 15 including a number of faces 20. Located on an end of the transfer chamber 15 are provisions for mounting a number of process chambers 25 (FIG. 2A). These process chambers 25 mounted to these locations would be configured for performing one or more manufacturing operations on a wafer 100.

Turning to a top schematic view shown in FIG. 2A, the cluster tool 10 has, disposed in the transfer chamber 15, a wafer handling robot 30. Robot 30 is disposed in a centermost portion of the transfer chamber 15 for automatically transferring a wafer 100 between various chambers. The wafer handling robot 30 is configured to move the wafer 100 from a load lock chamber 40a to the transfer chamber 15, and subsequently to pick and place the wafers 100 in the process chambers 25. Although, shown with six wall faces 20, one of ordinary skill in the art should appreciate that this configuration is not limiting, and the transfer chamber 15 may be formed with any number of faces 20.

The cluster tool 10 also includes a first load lock chamber 40a and a second load lock chamber 40b. Although shown with two load lock chambers 40a, 40b, this number is not limiting, and the cluster tool 10 may be formed with any number of load lock chambers 40a, 40b. The first and second load lock chambers 40a, 40b preferably have valves to selectively open and close the load lock chambers 40a, 40b from ambient conditions. In operation, a wafer 100 will be transferred through the first load lock chamber 40a and into the transfer chamber 15. Once the wafer 100 is located in the transfer chamber 15, wafer handling robot 30 moves the wafer 100 into the process chamber 25 for further operations. Likewise, at the conclusion, another wafer 100 will be sequentially transferred through the second load lock chamber 40b and into the transfer chamber 15. Once the second wafer 100 is located in the transfer chamber 15, wafer handling robot 30 moves the wafer into another process chamber 25.

The present cluster tool 10 preferably has an adaptor that acts as a buffer that permits the transfer chamber 15 to recover to a desired vacuum pressure, or a pressure of $10^{-7}$ Torr, in a rapid manner, once the transfer chamber 15 receives a wafer 100. The present cluster tool 10 has the buffer located between a first load lock chamber 40a and a transfer chamber 15 to prevent the pressure in the transfer chamber 15 from spiking or otherwise rising too quickly relative to an example where the transfer chamber 15 is opened directly adjacent to a load lock chamber 40a, 40b without any buffer. In that regard, the load lock chamber 40a having a higher pressure (since it communicates with ambient, and is subsequently pumped by a rough pump to a rough pump pressure) will likely increase the transfer chamber pressure during transfer of the wafer 100. Moreover, the present cluster tool 10 preferably decreases a total amount of valves that are present in the cluster tool 10 relative to prior cluster tool embodiments.

Figure 2B:
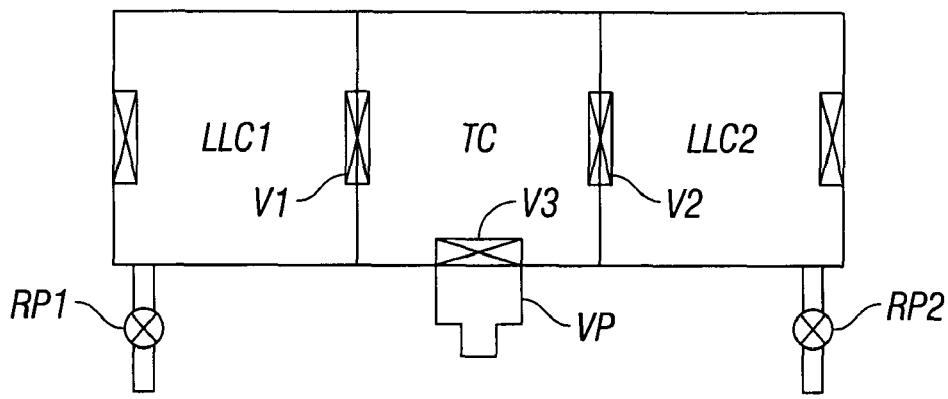
FIG. 2B shows a prior art configuration of a cluster tool.

Turning to FIG. 2B, there is shown a prior art configuration of a transfer chamber $T_C$ connected to load lock chambers $LLC_1$, $LLC_2$ at each end of the transfer chamber $T_C$. FIG. 2B shows a prior art configuration for comparison purposes. In this embodiment, a first load lock chamber $LLC_1$ is connected to the transfer chamber $T_C$ using a first valve $V_1$. Likewise, a second load lock chamber $LLC_2$ is connected to the transfer chamber $T_C$ using a second valve $V_2$. Disposed in the transfer chamber $T_C$ is a vacuum pump $V_P$ that is connected to the transfer chamber $T_C$ by a third valve $V_3$. The vacuum pump $V_P$ evacuates the transfer chamber $T_C$. Here, a costly isolation valve $V_3$ connects the transfer chamber $T_C$ to the vacuum pump $V_P$.

In this embodiment, the load lock chambers $LLC_1$, $LLC_2$ each communicate with atmospheric pressure. The load lock chambers $LLC_1$, $LLC_2$ also include a rough pump $Rp_1$, $Rp_2$ that pumps the load lock chambers $LLC_1$, $LLC_2$ from ambient to a rough pump pressure. Once a first valve $V_1$ is opened, to transfer the wafer from the first load lock chamber $LLC_1$ to the transfer chamber $T_C$, the pressure in the transfer chamber $T_C$ will spike or otherwise increase from the vacuum pressure of $10^{-7}$ Torr to a relatively higher pressure since the first load lock chamber $LLC_1$ communicates with a rough pump pressure attributed to the rough pump $RP_1$. Once the first valve $V_1$ is closed, then the opened isolation valve $V_3$ permits the vacuum pump $V_P$ to evacuate the transfer chamber $T_C$ or return the transfer chamber $T_C$ back from a relatively higher pressure to the vacuum pressure of $10^{-7}$ Torr.

Figure 2C:
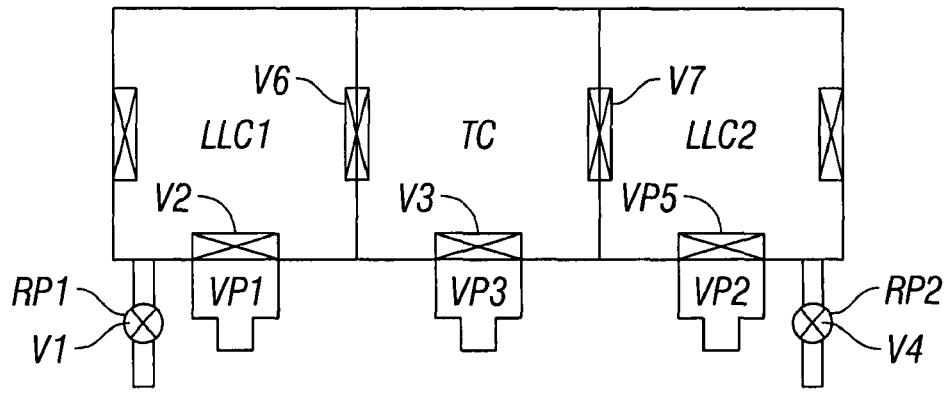
FIG. 2C shows another prior art configuration of a different cluster tool.

Turning to another prior art configuration of a transfer chamber $T_C$ connected to a pair of load lock chambers $LLC_1$, $LLC_2$, there is shown a configuration in FIG. 2C that attempts to prevent this condition by pumping each load lock chamber $LLC_1$, $LLC_2$ prior to wafer transfer. This cluster tool attempts to eliminate any pressure increase above $10^{-7}$ Torr in the transfer chamber $T_C$ during wafer transfer. In this prior art embodiment, like with the above embodiment shown in FIG. 2B, each of the load lock chambers $LLC_1$, $LLC_2$ is connected to a vacuum pump, $VP_1$, and $VP_2$, and a rough pump, $RP_1$, and $RP_2$. The first rough pump $RP_1$ is connected to the first load lock chamber $LLC_1$ by a valve $V_1$. A first vacuum pump $VP_1$ is also connected to the first load lock chamber $LLC_1$ by a second valve $V_2$.

The transfer chamber $T_C$ also has a vacuum pump $VP_3$ connected to the transfer chamber $T_C$ using an isolation valve $V_3$. A second rough pump $RP_2$ is connected to a second load lock chamber $LLC_2$ by a valve $V_4$, and a second vacuum pump $VP_2$ is connected to the second load lock chamber $LLC_2$ by a fifth valve $V_5$. Moreover, each of the load lock chambers, $LLC_1$, and $LLC_2$ also includes a valve $V_6$ and $V_7$ to seal the respective load lock chamber $LLC_1$, $LLC_2$ from the transfer chamber $T_C$.

In this embodiment, the recovery time for which the transfer chamber $T_C$ can recover, once the valve $V_6$ is opened, can be less relative to the embodiment of FIG. 2B since the vacuum pump $VP_1$ evacuates the first load lock chamber $LLC_1$ prior to wafer transfer. Here, once a wafer is introduced into the first load lock chamber $LLC_1$ from atmospheric pressure, the rough pump $RP_1$ pumps the first load lock chamber $LLC_1$ from atmospheric pressure to a rough pump pressure. The second valve, $V_2$ opens and the first vacuum pump $VP_1$ evacuates the first load lock $LLC_1$ to vacuum pressure conditions of the transfer chamber $T_C$.

Once the first load lock chamber $LLC_1$ is sufficiently evacuated, then the sixth valve $V_6$ will open to transfer the wafer from the first load lock chamber $LLC_1$ to the transfer chamber $T_C$. Similar operation occurs with the second load lock chamber $LLC_2$. Operation of the cluster tool 10 of the FIG. 2C embodiment has certain disadvantages since there are numerous costly valves that separate each vacuum pump $VP_1$, $VP_2$, $VP_3$ and respective chambers $LLC_1$, $LLC_2$, and $T_C$ and other valves $V_6$, and $V_7$ to separate the chambers themselves. Further, there are also additional valves $V_1$, and $V_2$ that separate the rough pumps $RP_1$, and $RP_2$ from the respective load lock chambers $LLC_1$, $LLC_2$. These numerous valves can be very costly and drive up the overall cluster tool installation cost. Operating the cluster tool by controlling these numerous valves in a precise manner can also be costly.

Figure 2D:
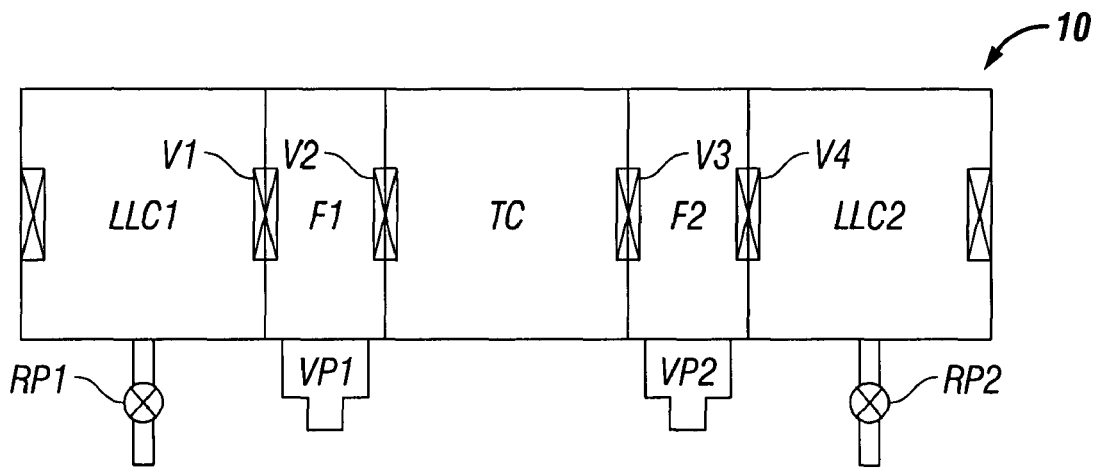
FIG. 2D shows another schematic view of the cluster tool of FIG. 2A.

Turning now to FIG. 2D, there is shown an embodiment of the present cluster tool 10. The cluster tool 10 includes a first facet adaptor $F_1$ that is placed between two chambers, or between a transfer chamber $T_C$ and a first load lock chamber $LLC_1$. The first facet adaptor $F_1$ includes a valve $V_1$ between the first facet adaptor $F_1$ and the first load lock chamber $LLC_1$ and valve $V_2$ located between the first facet adaptor $F_1$ and the transfer chamber $T_C$. Second facet adaptor $F_2$ includes a valve $V_3$ between a second facet adaptor $F_2$ and the transfer chamber $T_C$ and a valve $V_4$ positioned between the second facet adaptor $F_2$ and the second load lock chamber $LLC_2$.

In this manner, a vacuum pump $VP_1$ communicates with the first facet adaptor $F_1$ and is sealed from the first load lock chamber $LLC_1$ and the transfer chamber $T_C$. Thus, the first facet adaptor F1 can use inexpensive valves $V_1$, $V_2$ and provide a buffer to the transfer chamber $T_C$, since once the transfer chamber $T_C$ is opened, there will not be a dramatic pressure increase in the transfer chamber pressure $T_C$ from the vacuum pressure of $10^{-7}$ Torr.

A recovery time to go back to conditions in the transfer chamber $T_C$ before the second valve $V_2$ was opened can occur much quicker in the transfer chamber $T_C$ as shown in FIG. 2B, where the rough pump pressure cause the transfer chamber pressure to spike. This is relative to an instance where the transfer chamber $T_C$ is directly connected to the first load lock $LLC_1$. The second facet adaptor $F_2$ includes a similar configuration. Having both facet adaptors $F_1$, and $F_2$, the cluster tool 10 does not need costly isolation valves between the vacuum pump $VP_1$ and the housing of the facet adaptor $F_1$, or a valve between the second vacuum pump $VP_2$ and the housing of the second facet adaptor $F_2$. Further, a vacuum pump in the transfer chamber $T_C$ can be eliminated and the vacuum pump $Vp_1$ of the first facet adaptor $F_1$ and/or the second vacuum pump $Vp_2$ in the second facet adaptor $F_2$ can be used to evacuate the transfer chamber $T_C$.

This is also advantageous since the facet adaptors $F_1$, $F_2$ can undergo a regeneration operation while closing the respective valve ($V_2$ or $V_3$) to the transfer chamber $T_C$, while the other facet adaptor is available for use. This permits the facet adaptors $F_1$, $F_2$ having one vacuum pump $Vp_1$, $Vp_2$ to undergo regeneration operation(s) as needed, without taking the entire cluster tool off line, to ensure continuous cluster tool operation. With regard to the embodiments of FIG. 2B and 2C, the transfer chamber having a vacuum pump Vp (FIG. 2B) or $VP_3$ (FIG. 2C), the entire tool must be taken off line to regenerate that vacuum pump Vp (FIG. 2B) or $VP_3$ (FIG. 2C). With the present system of FIG. 2D, vacuum pump $VP_1$ may be taken offline and the cluster tool may use vacuum pump $VP_2$ to evacuate the transfer chamber. Also, vacuum pump $VP_2$ may be taken offline and the cluster tool may use vacuum pump $VP_1$ to evacuate the transfer chamber. This ensures continuous operation and this permits the remaining facet adaptor $F_2$ having the vacuum pump $Vp_2$ to continue operation during a regeneration operation of the first vacuum pump $Vp_1$ without taking the entire cluster tool off line to ensure continuous cluster tool operation. Before, with a vacuum pump located in the transfer chamber (FIGS. 2B and 2C), the entire cluster tool had to be taken off line for a regeneration operation. This may result in substantial down time. Other pumps are also envisioned, such as a turbo pump, high vacuum pump, or water vapor pump, and the present cluster tool 10 is not limited to any specific pump.

As shown in FIG. 2A, the cluster tool 10 according to the present disclosure includes a first facet adaptor 60 and a second facet adaptor 65 with each of the facet adaptors 60, 65 corresponding to a respective load lock chamber 40a, 40b. The first facet adaptor 60 includes a first facet adaptor housing 70 with an entrance 75 and an exit 80.

The entrance 75 faces the first load lock chamber 40a. The exit 80 faces the transfer chamber 15. The first facet adaptor 60 further includes a wafer path 70a disposed through the first facet adaptor housing 70. The first facet adaptor 60 also is isolated from the transfer chamber 15 and the first load lock 40a, respectively by a first valve 85 and a second valve 90. In one embodiment, the first and the second valves 85, 90 are slit valves; however, the cluster tool 10 is not limited to slit valves, and the first facet adaptor 60 may include gate valves, any other suitable inexpensive valve arrangement known in the art suitable to isolate a volume of the first facet adaptor 60 from the transfer chamber 15 and the first load lock 40a. It should be appreciated that in another embodiment, the valves 85, 90 may be suitable to form a very thin opening complementary to the thickness of the wafer 100, which is configured to permit a wafer 100 to pass through path 70a quickly, and then permit the valves 85, 90 to close.

In one embodiment, the wafer 100 may be pulled directly from the first load lock 40a and into the transfer chamber 15 through path 70a by robot 30. In another alternative embodiment shown in FIG. 3B, the first facet adaptor 60 further includes a wafer holder 70'. The wafer holder 70' is a stand or similar structure that permits the wafer 100 to rest or reside in the first facet adaptor 60. In this aspect, a second wafer handling robot (not shown) may be used to introduce the wafer 100 into the first facet adaptor 60. Thereafter, the wafer handling robot 30 in the transfer chamber 15 may be configured to sequentially withdraw the wafer 100 from the first facet adaptor 60 on wafer holder 70' and move the wafer 100 into the transfer chamber 15. It should be appreciated that the wafer holder 70' is a support structure that is disposed in the first facet adaptor housing 70 for which a wafer 100 may be rested thereon prior to being introduced into the transfer chamber 15. In one embodiment, the wafer holder 70' is a small platen with a three point stand that supports the wafer 100.

Figure 3A:
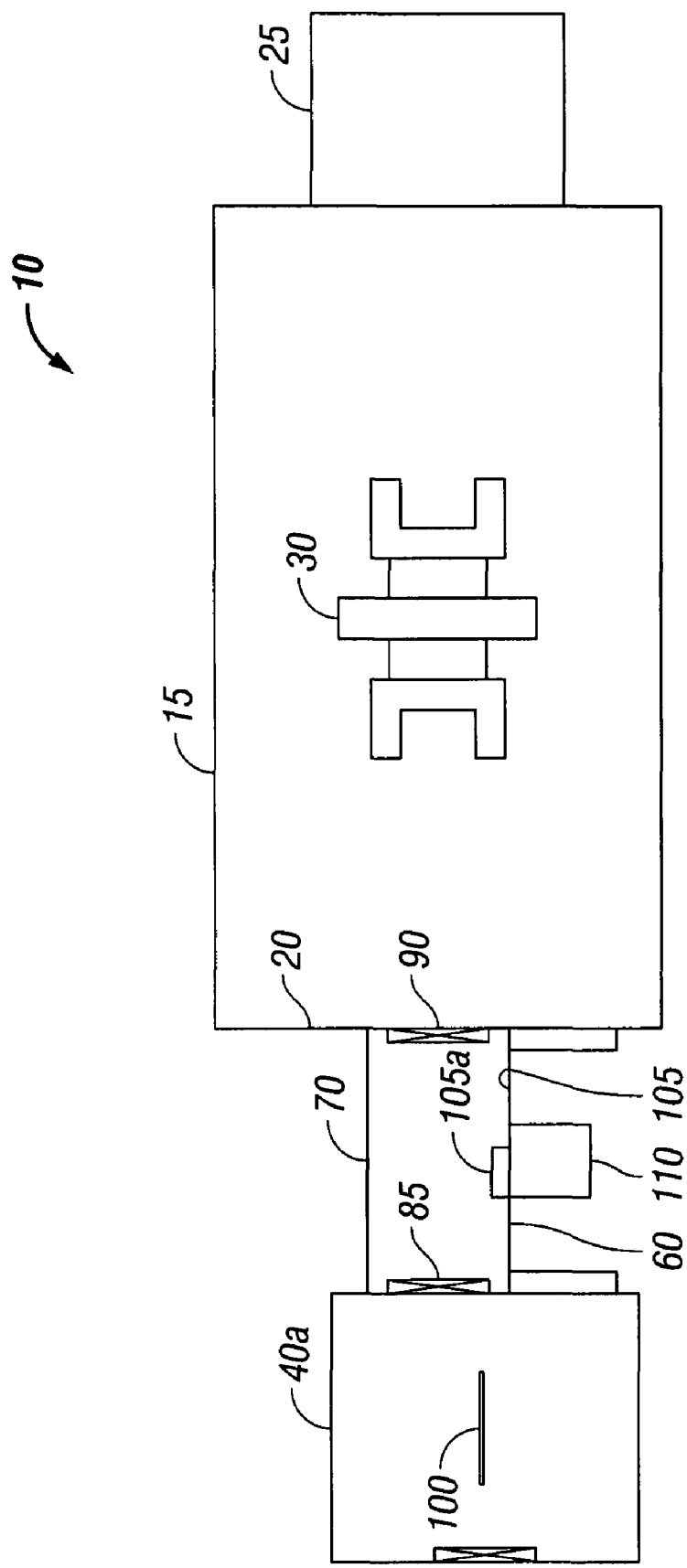
FIG. 3A shows a load lock chamber connected to the facet adaptor and the facet adaptor connected to a transfer chamber, which is connected to a process chamber.
Figure 3B:
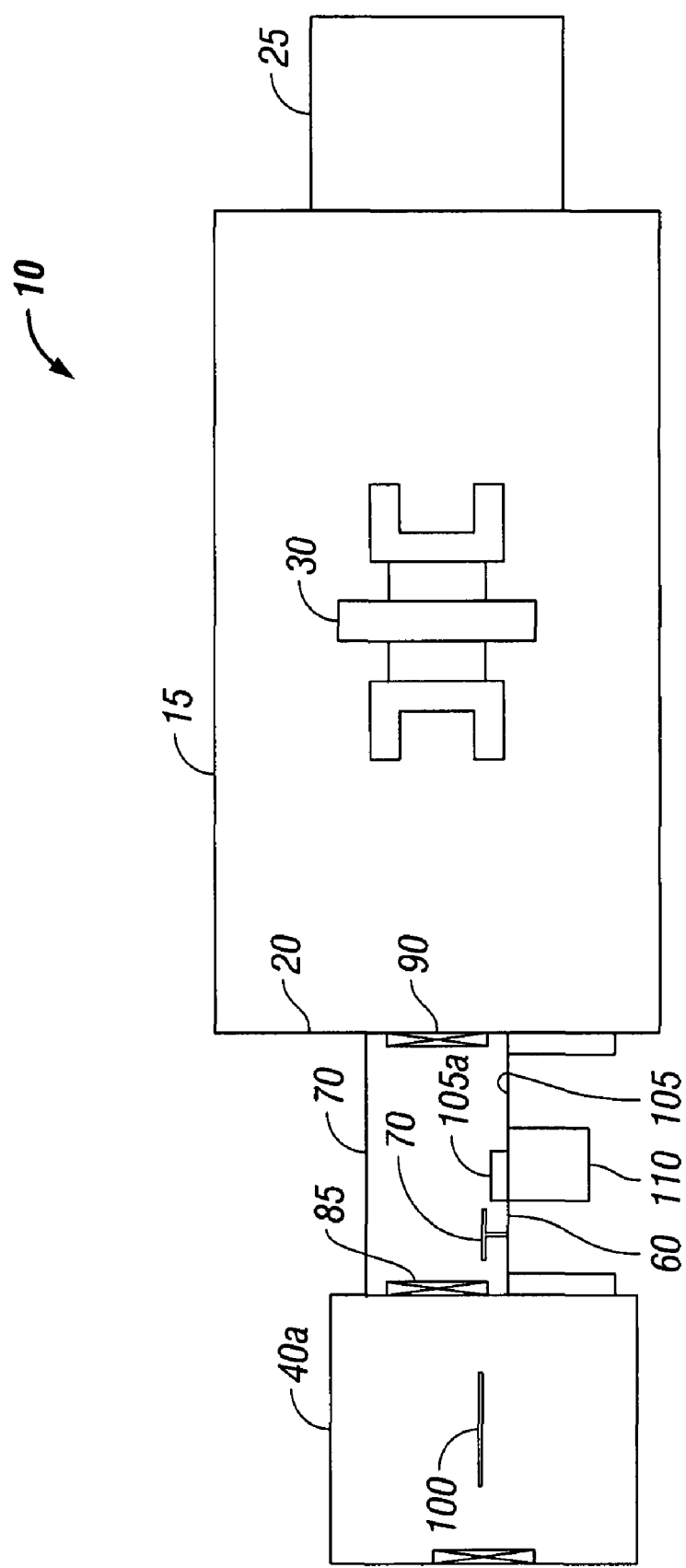
FIG. 3B shows another embodiment of the facet adaptor having a wafer holder.

Turning now to FIG. 3A, there is shown a side cut away view of the first load lock 40a connected to the first facet adaptor 60, which is connected to the transfer chamber 15 along face 20, with the wafer holder 70' removed. The first facet adaptor 60 also includes a pressure sensor 105a to detect the pressure therein and also has a cryogenic refrigerator (not shown) connected to a cryogenic pump 110. A cryogenic pump 110 that may be used in connection with the present disclosure is described in detail in U.S. Pat. No. 5,782,096 to Bartlett et al., which is incorporated by reference in its entirety.

Generally, cryogenic pump 110 may include a low temperature second stage array, usually operating in the range of 4 degrees to 25 degrees Kelvin, as the primary pumping surface. Other primary pumping surfaces are also envisioned, such as, for example, a turbo-pump, water vapor pump, high vacuum pump or any other suitable pump known in the art. This primary pumping surface is surrounded by a high temperature cylinder, usually operated in the temperature range of 50 degrees to 130 degrees Kelvin, which provides radiation shielding to the lower temperature array. The radiation shield (not shown) generally comprises a housing which is closed except at a frontal array positioned between the primary pumping surface and the chamber to be evacuated. This higher temperature, first stage, frontal array serves as a pumping site for higher boiling point gases such as water vapor. High boiling point gases, such as water vapor, are condensed on the frontal array. Lower boiling point gases pass through that array and into the volume within the radiation shield and condense on the second stage array. A surface coated with an adsorbent such as charcoal or a molecular sieve operating at, or below, the temperature of the second stage array may also be provided in this volume to remove the very low boiling point gases. With the gases thus condensed or adsorbed onto the pumping surfaces, only a vacuum remains in the facet adaptor 60. Typically a two stage refrigerator having a cold finger, which extends through the radiation shield is used, and the cold end of the second, coldest stage of the refrigerator is at the tip of the cold finger. The primary pumping surface, or cryopanel, is connected to a heat sink at the coldest end of the second stage of the cold finger. This cryopanel may be a simple metal plate, a cup or a cylindrical array of metal baffles arranged around and connected to the second stage heat sink. This second stage cryopanel may also support low temperature adsorbent. The radiation shield (not shown) is connected to a heat sink at the coldest end of the first stage of the refrigerator. Various vacuum pumps may be used and the present disclosure is not limited to any specific high, or ultra-high vacuum pump. The facet adaptor 60 may also communicate with a water vapor pump, or a turbo pump. The cryogenic pump 110 may be located separate from the first facet adaptor housing 70, or alternatively, the housing 70 may be enlarged so that the vacuum pump 110 is integrated with the first facet adaptor housing 70.

The cryogenic pump 110 may evacuate the transfer chamber 15, or alternatively an additional, secondary ultrahigh vacuum pump (not shown) may be positioned in the transfer chamber 15 to evacuate the chamber 15. With the cryogenic pump 110 integrated into the facet adaptor housing 70, extensive downtime associated with a regeneration operation may be eliminated. In this aspect, the cryogenic pump 110 may undergo a regeneration operation, while another cryogenic pump for another facet adaptor remains to evacuate the transfer chamber. This may facilitate continued manufacturing operations in the transfer chamber while the first cryopump 110 undergoes a regeneration operation. In another embodiment, cryopump 110 may be sufficiently rated to evacuate multiple chambers.

Figure 4B:
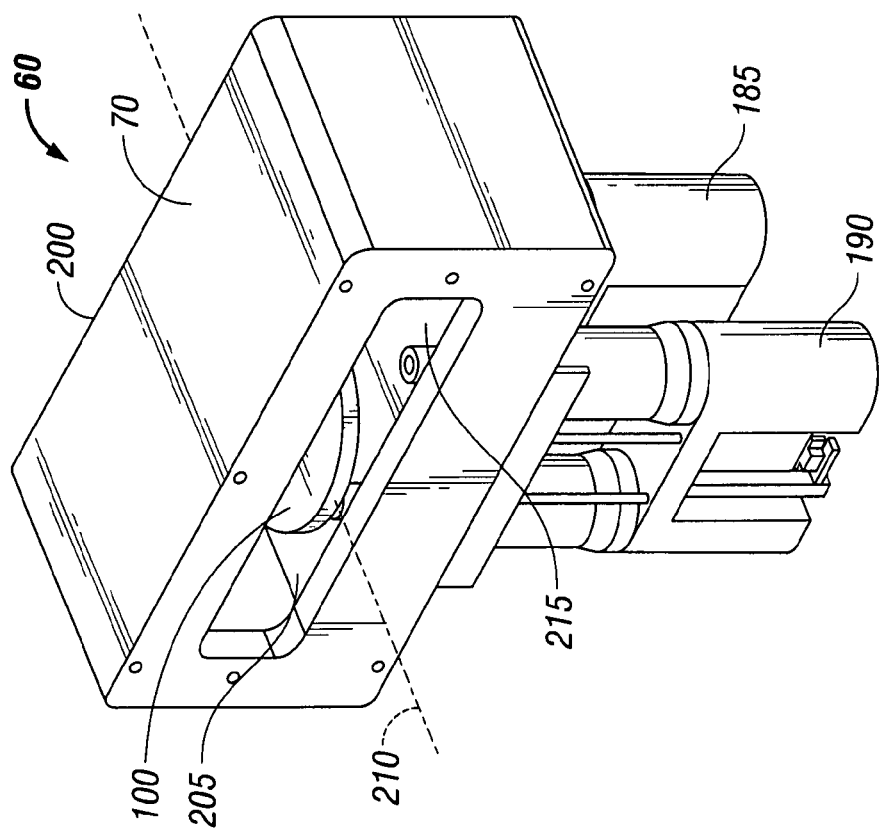
FIGS. 4A and 4B show rear and front perspective views of the facet adaptor of FIG. 3A.
Figure 4A:
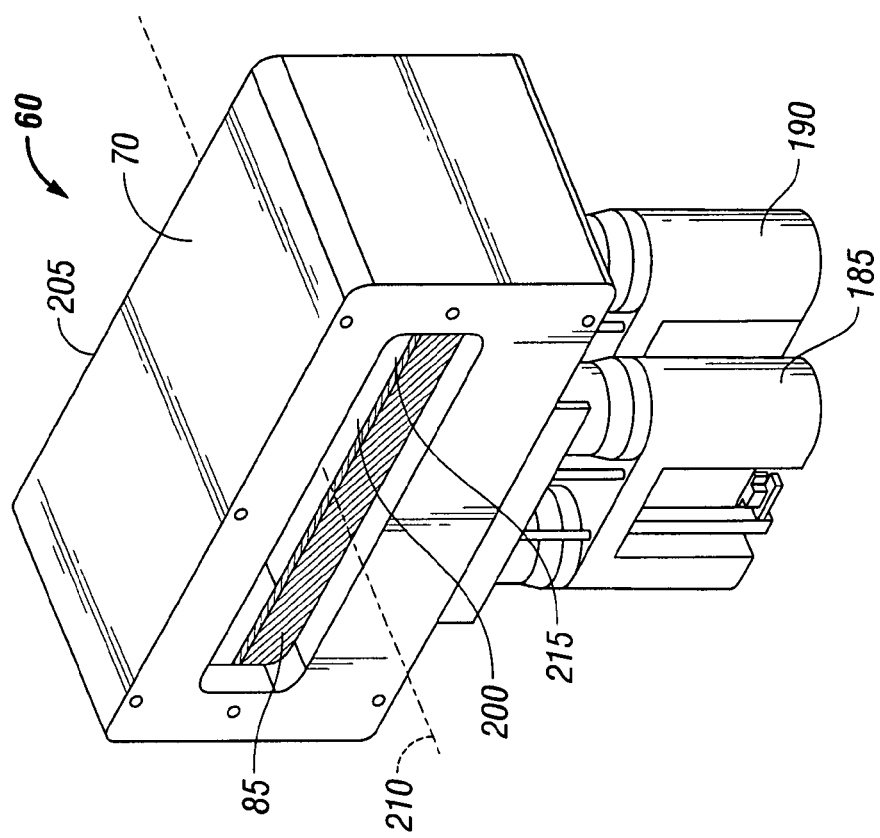

Turning now to FIGS. 4A and 4B, there is shown a perspective view of a first facet adaptor or buffer 60 having an entrance 200 and an opposite exit 205 with the facet adaptor 60 disconnected from the load lock chamber 40a and the transfer chamber 15. The first facet adaptor 60 is shown as having a wafer path 210 being disposed therethrough. In FIG. 4A, the first facet adaptor 60 includes a first slit valve 85 that is partially closed over an entrance 200. On an opposite side shown in FIG. 4B, another second valve is retracted (not shown) and in an open positioned. Each valve 85, 90 is connected to a pneumatic device along supply lines 185, 190 for opening and closing the first slit valve 85 and the second slit valve 90. The first facet adaptor 60 preferably also has a suitable interior space 215 for forming path 210. The interior space 215 is suitably large such that a wafer 100 (FIG. 4B) may be passed through the housing 70. As mentioned, interior space 215 can be suitably large, such that a wafer stand 70' is also housed therein.

Figure 5:
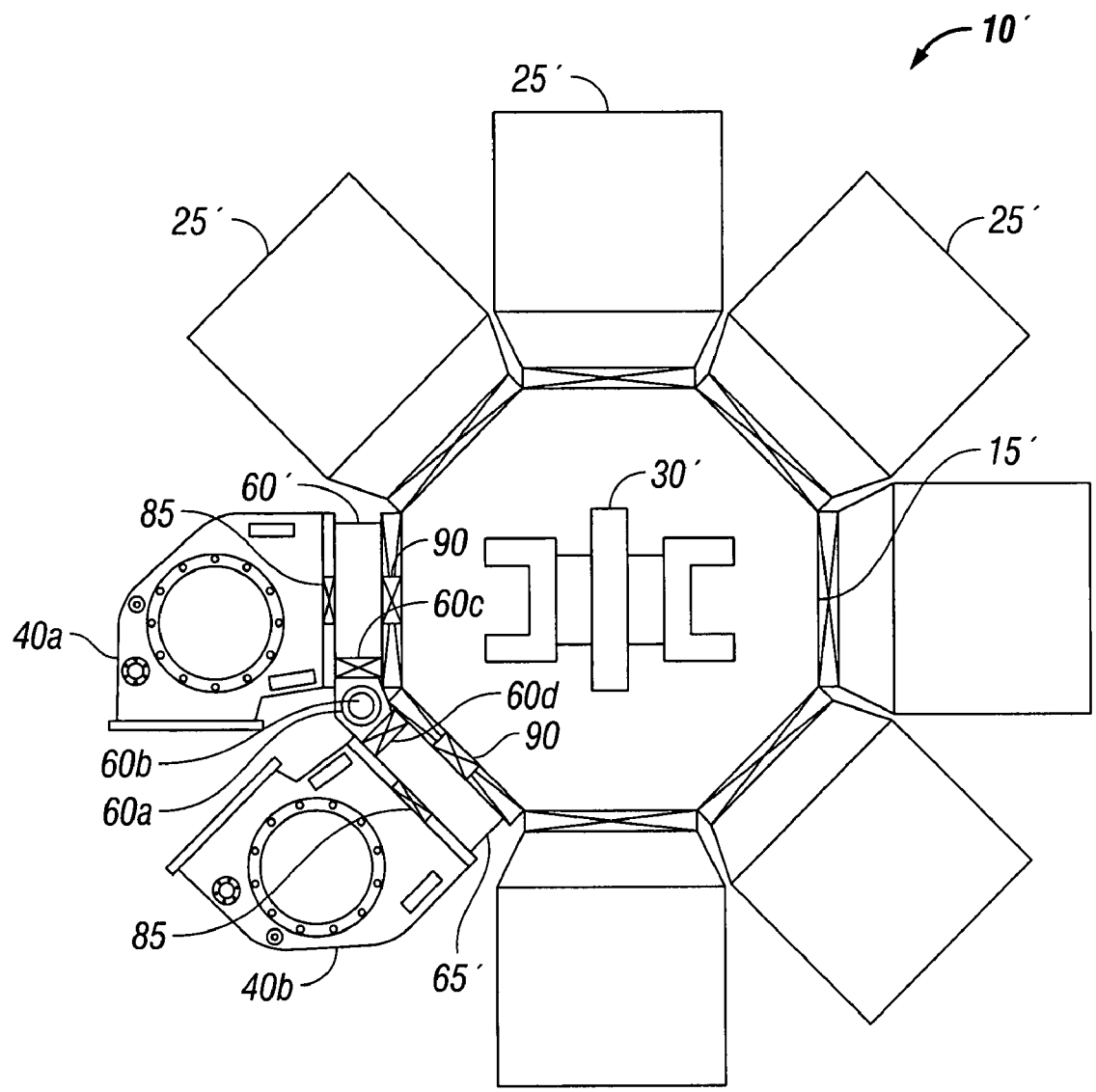
FIG. 5 show another embodiment of the present cluster tool with a first facet adaptor and a second facet adaptor sharing a compartment having a common cryogenic pump.

Turning now to FIG. 5, there is shown another embodiment of a cluster tool according to the present invention generally represented by reference numeral 10'. In this embodiment, instead of having a cryogenic pump 110 with a cryogenic refrigerator associated with each facet adaptor 60, 65 as shown in FIG. 2, the cluster tool 10' may be configured so the facet adaptors 60, 65 share a common cryogenic pump 60b and cryogenic refrigerator. In this embodiment, the transfer chamber 15' includes a number of faces 20' similar to the embodiment discussed above. The cluster tool 10' can include process chambers 25', a first load lock chamber 40a, and a second load lock chamber 40b.

In this embodiment, the cluster tool 10' includes a first facet adaptor 60' and a second facet adaptor 65' that share a common housing 60a. Housing 60a is positioned between the adaptors 60', 65'. The cluster tool 10' may be manufactured with other similar housing(s) disposed between other adaptors located on the cluster tool 10'. The common housing 60a includes a common cryogenic pump 60b that can selectively evacuate either the first facet adaptor 60' or the second facet adaptor 65' and may be configured with valves 60c, 60d on either side of the housing 60a.

Cryogenic pump 60b may evacuate either the first facet adaptor 60', the second facet adaptor 65', or both and/or other chambers of the cluster tool 10' (such as the transfer chamber 15). The cluster tool 10' of FIG. 5 advantageously uses less hardware to evacuate multiple wafer paths.

Figure 6A:
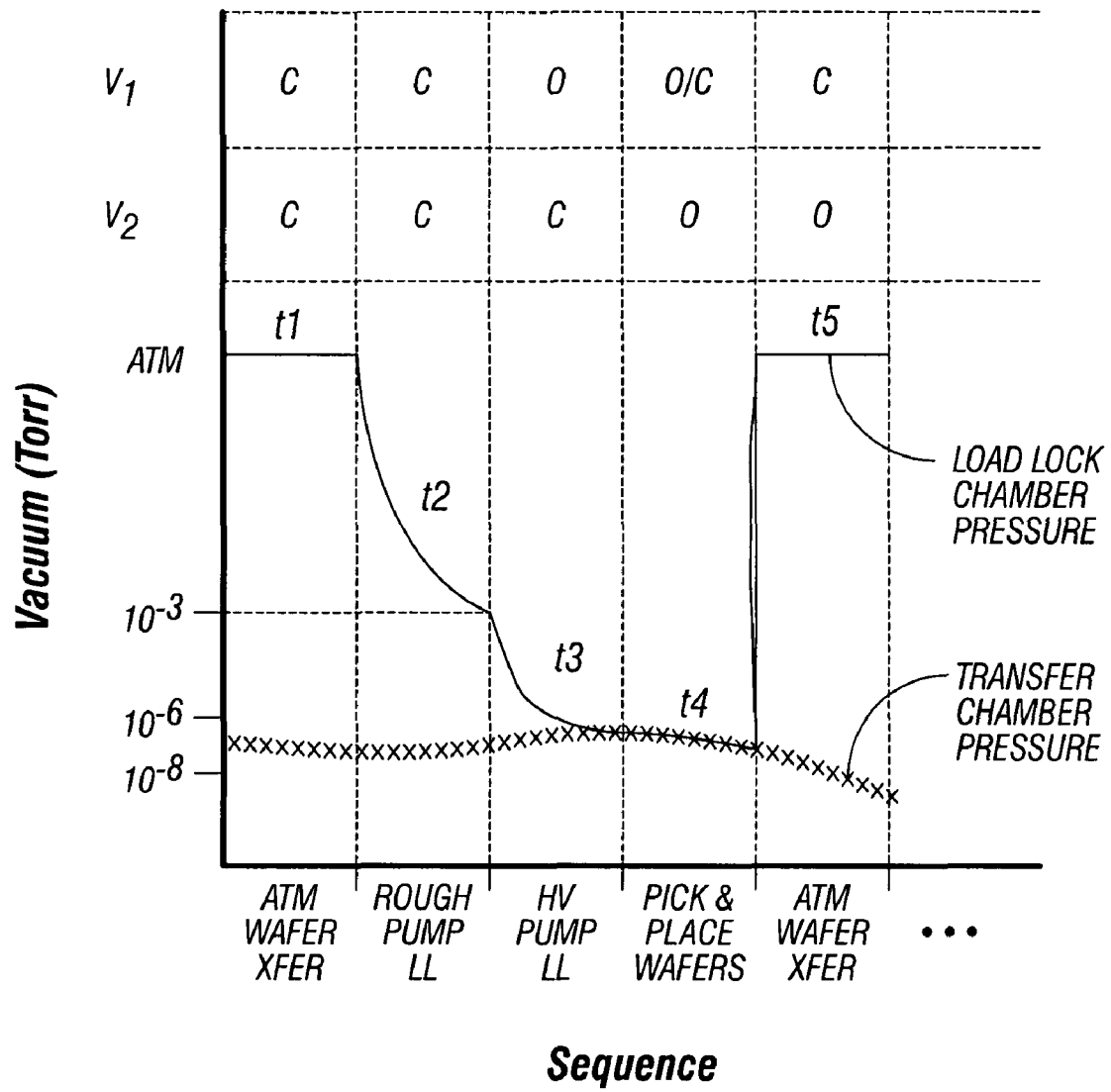
FIG. 6A shows pressure plots of a transfer chamber and a load lock chamber over a sequence of operation of the cluster tool of the present disclosure as compared with the operation of a cluster tool of FIG. 2C.

Turning now to FIG. 6A, there is shown two pressure plots during a sequence of operation of a wafer traversing from the load lock chamber 40a through the first facet adaptor 60 and into the transfer chamber 15 (FIG. 2A). A first plot shows a load lock chamber pressure. A second plot shows a transfer chamber pressure. The slit valve 85 on the load lock side of the facet adaptor 60 is closed while the slit valve 90 on the transfer chamber side of the facet adaptor 60 is opened during time interval $t_1$. Here, the wafer is at atmospheric pressure in the load lock chamber 40a. During time interval $t_2$, the load lock chamber 40a is "rough pumped" from atmospheric pressure to a pressure of $1 \times 10^{-3}$ Torr.

During interval time $t_2$, the slit valve 85 (on the load lock chamber side of the facet adaptor 60) is closed while the slit valve 90 (on the transfer chamber side of the facet adaptor 60) is opened. During interval time $t_3$, the slit valve 85 on the load lock side of the facet adaptor 60 is opened, and the slit valve 90 on the transfer chamber side of the facet adaptor 60 is closed.

During time interval $t_4$, both slit valves 85, 90 are opened. During time interval $t_4$, the wafer handling robot 30 manipulates the wafer 100 from the load lock chamber 40a through the facet adaptor 60 and into the transfer chamber 15. Thereafter, during time interval $t_5$, the load lock chamber slit valve 85 is closed while the transfer chamber slit valve 90 is opened and the pressure in the load lock chamber 40a returns to atmospheric pressure. Notably, the pressure of the transfer chamber 15 is held relatively in a range of a vacuum pressure (Torr) due to buffering function of the facet adaptor 60 during time intervals $t_3$ and interval $t_4$ and the pressure in the transfer chamber 15 does not substantially spike or increase, but remains at the vacuum pressure.

Figure 6B:
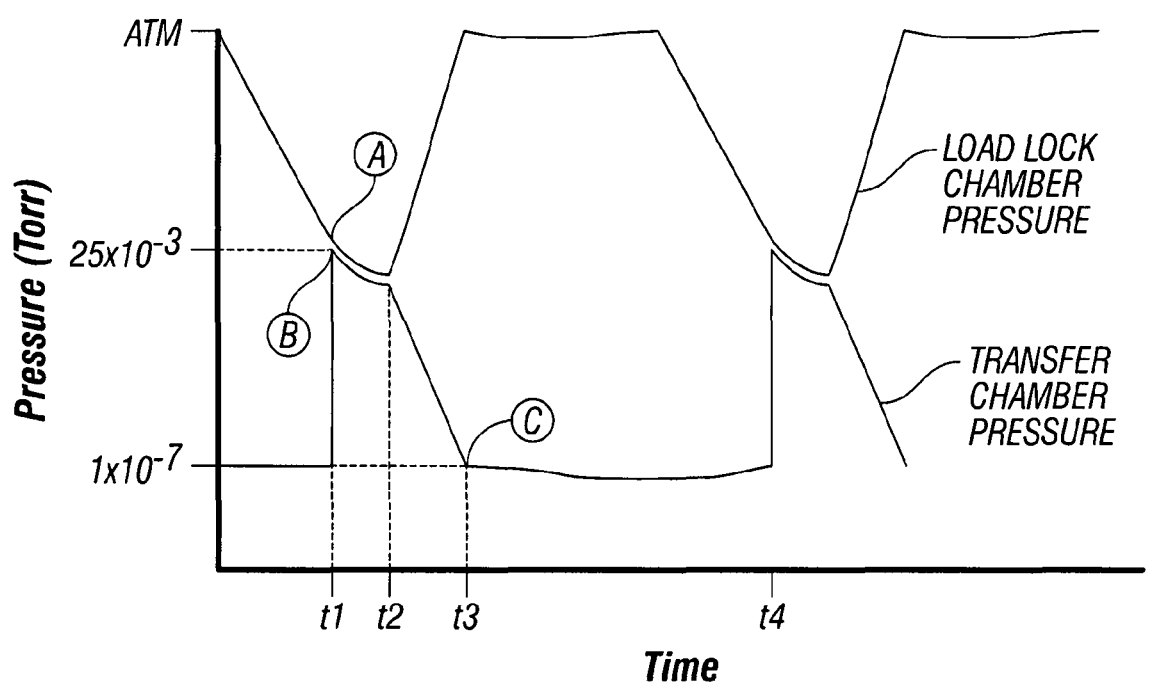
FIG. 6B show a pressure plot over a sequence of operation of a prior cluster tool shown in FIG. 2B.

Contrast the above operation with FIG. 6B. FIG. 6B shows two pressure plots over time for a prior art cluster tool configuration shown in FIG. 2B for comparison purposes. The first plot shows the pressure reading of a first sensor in the load lock chamber $LLC_1$. The second plot shows the pressure reading of a second sensor in a transfer chamber $T_C$. First pressure plot shows the rough pumping pressure plot sequence from atmospheric pressure to a rough pump pressure. Later, vacuum pump $V_P$ evacuates the transfer chamber $T_C$ and brings the pressure down from $25 \times 10^{-3}$ Torr to $10^{-7}$ Torr.

Once a valve $V_1$ is opened (that separates the transfer chamber $T_C$ and the first load lock chamber $LLC_1$) the pressure in the transfer chamber $T_C$ rises at sequence B from $10^{-7}$ Torr and spikes upwardly to $25 \times 10^{-3}$ Torr. After wafer transfer takes place and the valve $V_1$ is closed, vacuum pump $V_P$ evacuates the transfer chamber $T_C$ back to the transfer chamber pressure $10^{-7}$ Torr (as shown by sequence C).

The present cluster tool 10 avoid this costly time for the transfer chamber to recover to the vacuum pressure of $10^{-7}$ Torr, after wafer transfer, by providing a buffer. Moreover, the present cluster tool 10 provides this without costly additional valves. This quick recovery time increases throughput of the cluster tool 10.

Turning now again to FIG. 6A, there is shown a graph of a pressure plot of a load lock chamber pressure of the tool configuration of FIG. 2D. During time interval $t_1$, the first load lock chamber $LLC_1$ is at atmospheric pressure, and both valves $V_1$ and $V_2$ are closed as shown on a top legend. During time interval $t_2$, a rough pump $Rp_1$ evacuates the load lock chamber $LLC_1$ from ambient to a rough pump pressure. During time interval $t_3$, a valve $V_2$ opens and a vacuum pump $Vp_1$ evacuates the load lock chamber $LLC_1$ further to a vacuum pressure of $10^{-7}$ Torr while valve $V_2$ is closed. Thereafter, during time interval t4, a valve $V_2$ opens for the wafer transfer to take place, and then valve V₁ closes once the wafer is correctly positioned in the transfer chamber T_C during time interval t5. During time interval t5, the valve V remains closed and the pressure returns in the load lock chamber LLC₁ to atmospheric pressure.

The cycle is then repeated in a continuous fashion in order to sequentially move wafers from atmosphere and high vacuum conditions of the process chambers. In this embodiment a single high vacuum pump V₁ performs the functions of the then high vacuum pumps shown in prior art FIG. 2C.

Figure 7:
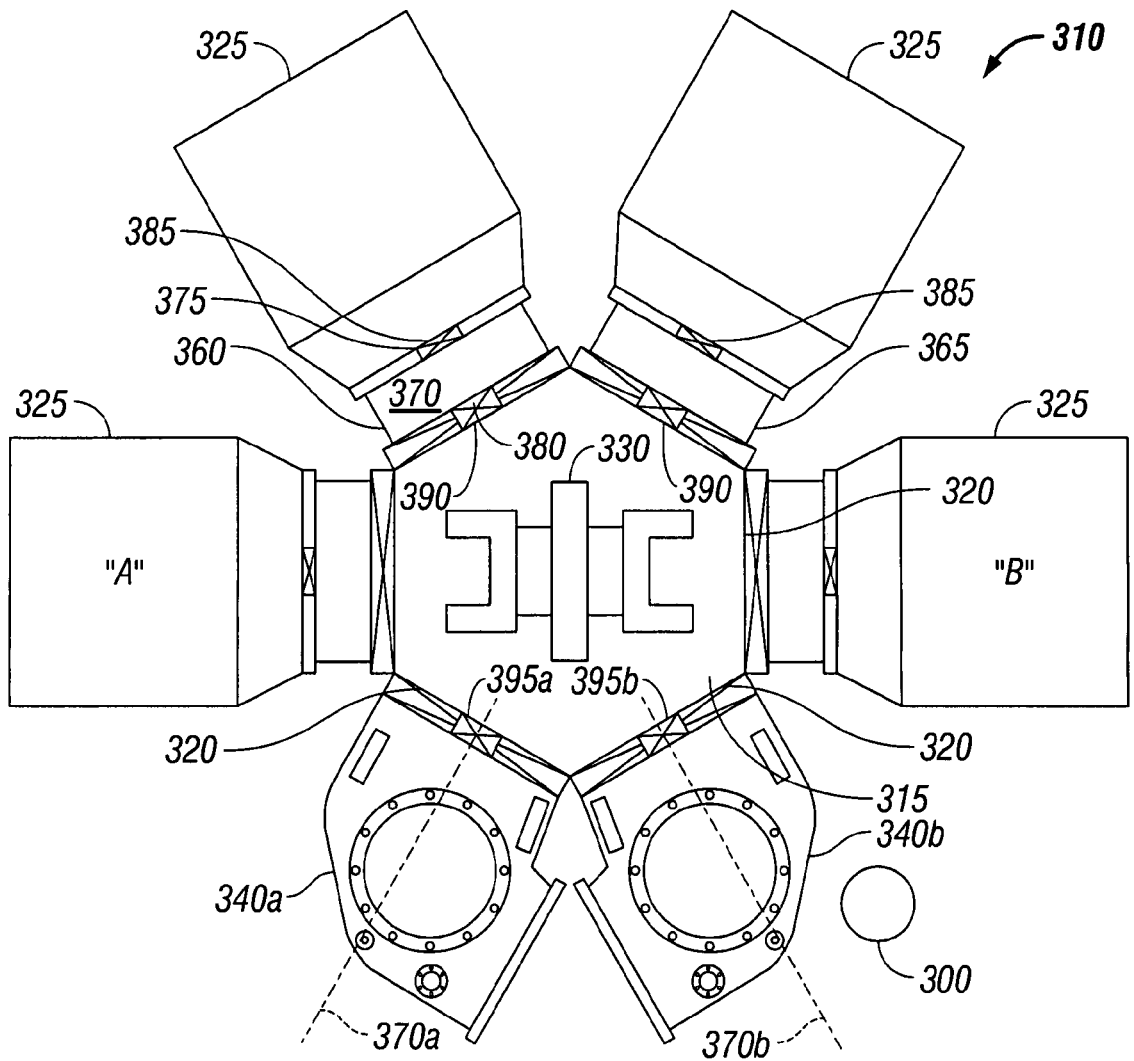
FIG. 7 shows a top schematic view of another embodiment of the cluster tool having a facet adapter being located between a process module, and a transfer chamber.

FIG. 7 shows another exemplary embodiment of the present cluster tool 310. In this embodiment, a first adaptor 360 is placed between the process module 325a and the transfer chamber 315. A second adaptor 365 is placed between the process module 325b and the transfer chamber 315. The first adaptor 360 includes valves 385, and 390 and second adaptor 365 includes valves 385, 390. The first and second adaptors 360, 365 can act as a buffer and isolate, and pump the transfer chamber 315 or the process modules 325a, 325b, as previously discussed. In this aspect, one process module 325a or 325b can be selectively isolated from the transfer chamber 315 while the other process module 325a or 325b can be used for continuous cluster tool operations. It should be appreciated that in each of the embodiments discussed above the adaptors 360, 365 may include a single pump or work together with multiple pumps. Various pump configurations are possible and within the scope of the present disclosure, and the disclosed tool are not limited to any specific pumps.

While this invention has been particularly shown and described with references to preferred embodiments thereof, it will be understood by those skilled in the art that various changes in form and details may be made therein without departing from the scope of the invention encompassed by the appended claims.

What is claimed is:

1. A multi-chamber tool comprising:
   a first chamber;
   a second chamber;
   an adaptor configured to be coupled between the first chamber and the second chamber, the adaptor comprising:
      an adaptor housing with an interior space including an entrance with a first valve and an exit with a second valve, the adaptor housing forming a path through the interior space;
   the first valve connecting the interior space and the first chamber;
   the second valve connecting the interior space and the second chamber; and
   a cryogenic surface associated with the adaptor, the cryogenic surface configured to selectively evacuate the interior space, a substrate being adapted to be moveable through the first valve and through the adaptor housing along the path and configured to be moveable through the exit and into the second chamber once the second valve is opened.

2. The multi-chamber tool of claim 1, wherein the cryogenic surface is associated with a cryogenic vacuum pump.

3. The multi-chamber tool of claim 1, wherein the cryogenic surface is configured to evacuate both the second chamber and the adaptor housing.

4. The multi-chamber tool of claim 1, wherein the cryogenic surface is configured to evacuate the second chamber and prevent a pressure spike in the second chamber during transfer of the substrate from the first chamber to the second chamber.

5. The multi-chamber tool of claim 1, wherein the cryogenic surface is associated with a cryogenic vacuum pump that is located outside of the adaptor housing.

6. The multi-chamber tool of claim 1, wherein the cryogenic surface is associated with a vacuum pump, and wherein the adaptor housing and the vacuum pump can be taken offline from the multi-chamber tool for a regeneration operation, while a second adaptor including a second vacuum pump is operable to evacuate the second chamber for substantially continuous tool operation.

7. The multi-chamber tool of claim 1, further comprising a pressure sensor in the interior space.

8. The multi-chamber tool of claim 1, wherein the first valve is a slit valve.

9. The multi-chamber tool of claim 1, wherein the second valve is a slit valve.

10. The multi-chamber tool of claim 1, further comprising a substrate holder.

11. The multi-chamber tool of claim 1, further comprising a second adaptor housing including a second interior space with a second entrance and a second exit and forming a second path through the second interior space, the first interior space communicating with the second interior space, wherein the first housing and the second housing share the cryogenic surface.

12. The multi-chamber tool of claim 11, wherein the second housing includes a third valve between the second housing and a third chamber and a fourth valve between the second housing and the second chamber.

13. The multi-chamber tool of claim 12, wherein at least one of the third and fourth valves is a slit valve.

14. The multi-chamber tool of claim 11, wherein the cryogenic surface is associated with a cryogenic pump and a cryogenic refrigerator, the cryogenic pump being located in a shared compartment, the shared compartment being positioned between the first housing and the second housing.

15. An adaptor configured to be positioned between a first chamber and a second chamber, the adaptor comprising:
   an adaptor housing including an interior space including an entrance and an exit and forming a path through the interior space;
   a first valve to communicate with the interior space and configured to be coupled to the first chamber;
   a second valve to communicate with the interior space and configured to be coupled to the second chamber; and
   a cryogenic surface associated with the adaptor housing and communicating with the interior space, the cryogenic surface configured to evacuate the interior space.

16. The adaptor of claim 15, wherein the cryogenic surface is associated with a cryogenic pump located outside of the adaptor housing.

17. The adaptor of claim 15, wherein the cryogenic surface is configured to evacuate the second chamber and prevent a pressure spike in the second chamber during transfer of the wafer from the first chamber to the second chamber.

18. The adaptor of claim 15, wherein the cryogenic surface is associated with a vacuum pump, and wherein the adaptor housing and the vacuum pump can be taken offline from a multi-chamber tool for a regeneration operation, and a second adaptor having a second vacuum pump is operable for substantially continuous operation of the multi-chamber tool.

19. The adaptor of claim 15, wherein the cryogenic surface is associated with a cryogenic pump, and wherein the cryogenic pump evacuates both the adaptor housing and the second chamber.

20. An adaptor configured to be positioned between a process module and a transfer chamber, or a load lock chamber and a transfer chamber, the adaptor comprising:
- an adaptor housing including an interior space with an entrance and an exit and forming a path through the interior space;
- a first valve communicating with the interior space, and configured to be coupled to the process module or the load lock chamber;
- a second valve communicating with the interior space, and configured to be coupled to the transfer chamber; and
- a cryogenic surface associated with the adaptor housing, and communicating with the interior space, the cryogenic surface configured to evacuate the interior space.

21. The adaptor of claim 20, wherein the cryogenic surface is associated with a cryogenic pump being located outside the adaptor housing.

22. The adaptor of claim 20, wherein the cryogenic surface is configured to pump either the transfer chamber, the process module, or the load lock chamber.

23. The adaptor of claim 20, wherein the cryogenic surface is associated with a vacuum pump, and wherein the adaptor housing and the vacuum pump can be taken offline from a multi-chamber tool for a regeneration operation, and further comprising a second adaptor with a second vacuum pump being operable for substantially continuous operation of the multi-chamber tool.

24. The adaptor of claim 20, wherein the cryogenic surface is associated with a cryogenic pump, and wherein the cryogenic pump evacuates both the adaptor housing and the process module or both the adaptor housing and the load lock chamber.

25. A multi-chamber tool comprising:
- a transfer chamber;
- a process module;
- an adaptor configured to be coupled between the transfer chamber, and the process module, the adaptor comprising;
- an adaptor housing with an interior space including an entrance with a first valve, and an exit with a second valve, the adaptor housing forming a substrate path through the interior space;
- the first valve connecting the interior space and the process module;
- the second valve connecting the interior space and the transfer chamber;
- a pump associated with the adaptor, and configured to selectively evacuate the interior space, the substrate being adapted to be moveable through the first valve and through the adaptor housing along the path, and moveable through the exit and into the process module,
- wherein the pump is associated with a cryogenic surface, and wherein the cryogenic surface is configured to evacuate both the transfer chamber, and the adaptor housing.

26. The multi-chamber tool of claim 25, wherein the cryogenic surface is configured to evacuate the transfer chamber, and prevent a pressure spike in the transfer chamber during transfer of the wafer from the transfer chamber to the process module.

27. The multi-chamber tool of claim 25, wherein the cryogenic surface is associated with a cryogenic vacuum pump located outside of the adaptor housing.

28. The multi-chamber tool of claim 25, wherein the cryogenic surface is associated with a vacuum pump and wherein the adaptor housing, and the vacuum pump can be taken offline from the multi-chamber tool for a regeneration operation, while a second adaptor with a second vacuum pump is operable to evacuate the transfer chamber for substantially continuous multi-chamber tool operation.

29. The multi-chamber tool of claim 25, further comprising a pressure sensor in the interior space.

30. The multi-chamber tool of claim 25, wherein at least one of the first valve or the second valve, or both are slit valves.

31. The multi-chamber tool of claim 25, further comprising a substrate holder.

* * * * *